United States Patent
Doris et al.

(10) Patent No.: US 9,059,206 B2
(45) Date of Patent: Jun. 16, 2015

(54) EPITAXIAL GROWN EXTREMELY SHALLOW EXTENSION REGION

(71) Applicant: International Business Machines Corporation, Armonk, NY (US)

(72) Inventors: Bruce B. Doris, Brewster, NY (US); Thomas N. Adam, Slingerlands, NY (US); Kangguo Cheng, Schenectady, NY (US); Ali Khakifirooz, Mountain View, CA (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 13/709,095

(22) Filed: Dec. 10, 2012

(65) Prior Publication Data
US 2014/0159124 A1    Jun. 12, 2014

(51) Int. Cl.
| H01L 21/337 | (2006.01) |
| H01L 21/336 | (2006.01) |
| H01L 29/66 | (2006.01) |
| H01L 29/78 | (2006.01) |
| H01L 29/165 | (2006.01) |

(52) U.S. Cl.
CPC ...... *H01L 29/6653* (2013.01); *H01L 29/66545* (2013.01); *H01L 29/66553* (2013.01); *H01L 29/6659* (2013.01); *H01L 29/66636* (2013.01); *H01L 29/7833* (2013.01); *H01L 29/7834* (2013.01); *H01L 29/7848* (2013.01); *H01L 29/165* (2013.01)

(58) Field of Classification Search
USPC .................. 257/369, 384, 408; 438/299, 305
See application file for complete search history.

(56) References Cited

U.S. PATENT DOCUMENTS

| 6,521,502 | B1* | 2/2003 | Yu .................................. 438/305 |
| 7,795,097 | B2 | 9/2010 | Pas |
| 8,263,467 | B2 | 9/2012 | Grupp et al. |
| 8,273,617 | B2 | 9/2012 | Thompson et al. |
| 2007/0267703 | A1* | 11/2007 | Chong et al. .................. 257/368 |
| 2008/0067587 | A1* | 3/2008 | Gossner et al. ............... 257/336 |
| 2008/0265322 | A1* | 10/2008 | Lin et al. ........................ 257/347 |
| 2008/0277734 | A1* | 11/2008 | Bhattacharyya et al. ..... 257/369 |
| 2010/0044782 | A1* | 2/2010 | Carter et al. ................... 257/327 |
| 2010/0065924 | A1* | 3/2010 | Lin et al. ........................ 257/408 |
| 2010/0276761 | A1* | 11/2010 | Tung et al. ..................... 257/384 |
| 2012/0235244 | A1 | 9/2012 | Yin et al. |
| 2013/0032859 | A1* | 2/2013 | Pei et al. ........................ 257/192 |
| 2013/0157431 | A1* | 6/2013 | Tsai et al. ...................... 438/299 |
| 2013/0178024 | A1* | 7/2013 | Flachowsky et al. ......... 438/199 |

FOREIGN PATENT DOCUMENTS

WO    2014093217 A1    6/2014

OTHER PUBLICATIONS

International Search Report and Written Opinion, PCT/US13/73857, Date of mailing Jan. 14, 2014.

* cited by examiner

*Primary Examiner* — Shaun Campbell
*Assistant Examiner* — Ismail Muse
(74) *Attorney, Agent, or Firm* — Teddi E. Maranzano; Joseph Petrokaitis

(57) ABSTRACT

A method to scale a MOSFET structure while maintaining gate control is disclosed. The extension regions of the MOSFET are formed by epitaxial growth and can be formed after the completion of high temperature processing. The extensions can be extremely shallow and have an abrupt interface with the channel. A dummy gate can establish the position of the abrupt interfaces and thereby define the channel length. The gate electrode can be formed to align perfectly with the channel, or to overlap the extension tip.

5 Claims, 14 Drawing Sheets

EPITAXIAL GROWN EXTREMELY SHALLOW EXTENSION REGION

BACKGROUND

The present invention relates to semiconductor integrated circuits and, more particularly, relates to MOSFET structures having a short channel length.

Today's integrated circuits may contain millions of field effect transistors (FETs) formed in a semiconductor substrate and connected by interconnect wiring formed in the 'back end' layers. The typical FET includes a channel region in a semiconductor substrate, the channel being under a gate electrode that is insulated from the substrate by an oxide or other dielectric layer, and a source and a drain on opposite sides of the channel.

The industry continues to strive for higher performance integrated circuits to provide greater functionality and/or lower cost. One approach is to reduce the footprint of each FET. But as the channel length decreases, various so-called "short channel" effects can reduce the controllability of a FET. For example, whereas ideally the current in the channel is either on or off and is fully controlled by the gate, as the source and drain regions get closer, a substantial 'subthreshold' current flows regardless of whether the gate is on or off, so the FET is no longer effective as a switch.

Conventionally the source and drain regions are highly doped regions adjacent to the gate formed by ion implantation followed by annealing to incorporate the dopant into the crystal lattice. As shown in FIGS. 1a and 1b, stack 111 can mask a channel region 102 as adjacent regions 130 are lightly doped using a first ion implantation 181. Spacer 114 can be formed on the gate sidewalls, forming a mask that protects an extension region 133 on the gate-side portion of region 130 during a second implantation 182 to create the source drain regions 135. After ion implantation, the dopant is incorporated into the lattice (and other dislocations caused by the implantation can be repaired) by annealing.

A problem from such annealing is illustrated in FIG. 1c. The boundary between the highly doped S/D region and the substrate body is not abrupt; rather ion implantation creates a boundary region across which the ion dopant concentration tapers off. The high temperature anneal drives diffusion of the dopant, which further broadens the boundary region; moving dopant vertically deeper 136 under the source/drain, and also laterally 137 further under the gate which lateral extension shortens the channel. As scaling continues to shorten the channel length, this boundary at the front of the extension region can effectively shorten the channel length or even create a short.

Another approach is to form spacers 214 on the stack 211 before any implanting of the source drain. Referring now to FIGS. 2a and 2b, stack 211 and spacer 214 can be formed over a channel region 202. Source drain regions 235 can be formed by high dose implantation 282 and an angled low dose ion implantation to direct a low dopant concentration under the spacer. A problem with this structure is that the extension region 238 has imprecise length. Annealing only worsens the situation. Dopant concentration tapers off at the edge of the implanted region, so there is no sharp or distinct boundary. The boundary instead is a region of at least several tens of nanometers across which the dopant concentration gradually declines. As the feature dimensions are scaled ever smaller, this boundary region creates variability in channel length and imprecise control, and limits the speed of the device.

There is a need for a process to form a FET structure that avoids the problems of the prior art while maintaining controllability by the gate.

BRIEF SUMMARY

According to a first embodiment, we claim a MOSFET structure having an extension region formed by in-situ doped epitaxy. The extension region can be extremely shallow and can have an abrupt interface with the channel.

According to another aspect of the invention, we claim a method to form a MOSFET, where the MOSFET includes a gate electrode disposed on a semiconductor substrate over a channel region and the channel region separates source drain regions, by forming extensions on the gate-facing side of the source drain regions by in-situ doped epitaxial growth. The method can include, prior to such epitaxial growth, forming a stack over said channel region and spacers on sidewalls of the stack, forming the source drain regions in the semiconductor substrate, depositing a layer to abut the spacers and cover the source drain regions, selectively removing the spacers to expose an area of said substrate, and forming a recess by etching said area.

According to yet another embodiment, the invention teaches a semiconductor structure having a substrate, a gate disposed on the substrate and over a channel region, a pair of source drain regions disposed on the substrate on opposite sides of the gate, and a pair of extensions separating said source drain regions from said channel, where the pair of extensions defines a pair of abrupt interfaces with the channel, and the distance between the abrupt interfaces is less than the width of the gate electrode.

BRIEF DESCRIPTION OF SEVERAL VIEWS OF THE DRAWINGS

Exemplary embodiments may best be understood by reference to the detailed description in conjunction with the accompanying figures. The Figures are provided for illustration and are not necessarily drawn to scale.

DETAILED DESCRIPTION

The present invention relates to a so-called 'metal oxide semiconductor field effect transistor' (MOSFET); 'so-called' because the gate electrode may not actually be metal and the insulator between the electrode and the substrate may not actually be oxide. More specifically, this disclosure enables forming a scaled MOSFET having a relatively short channel length while maintaining good gate control.

The present invention provides a method to form a FET with a precise channel length, even for a FET having a gate length in the sub 25 nm range. According to the present invention, the extension region on one or both sides of the channel can be formed with an abrupt interface between the extension and the channel. The channel length is the distance between a pair of such abrupt interfaces, and since the extension region can be formed after any high temperature processing is complete, such interfaces remain sharp and do not migrate. As such, the channel length can be precisely formed and controlled. Furthermore, this length can be longer or shorter than the width of the electrode.

The FET of the present invention includes a gate electrode over a channel region of a semiconductor substrate, and a source drain region on either side of the gate, and a shallow extension connecting a source drain to the channel. The gate electrode can be aligned with the channel, and in other embodiments the gate electrode can be placed to overlap the tip of the extension.

The exemplary embodiments, both as to organization and method of operation, may best be understood by reference to the detailed description which follows taken in conjunction with the accompanying figures. It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. Similarly, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Additionally, to the extent a feature is described to be horizontal or vertical, that orientation is with respect to a generally planar major surface of the substrate which can be in the form of a wafer or disk.

Figure 1A:
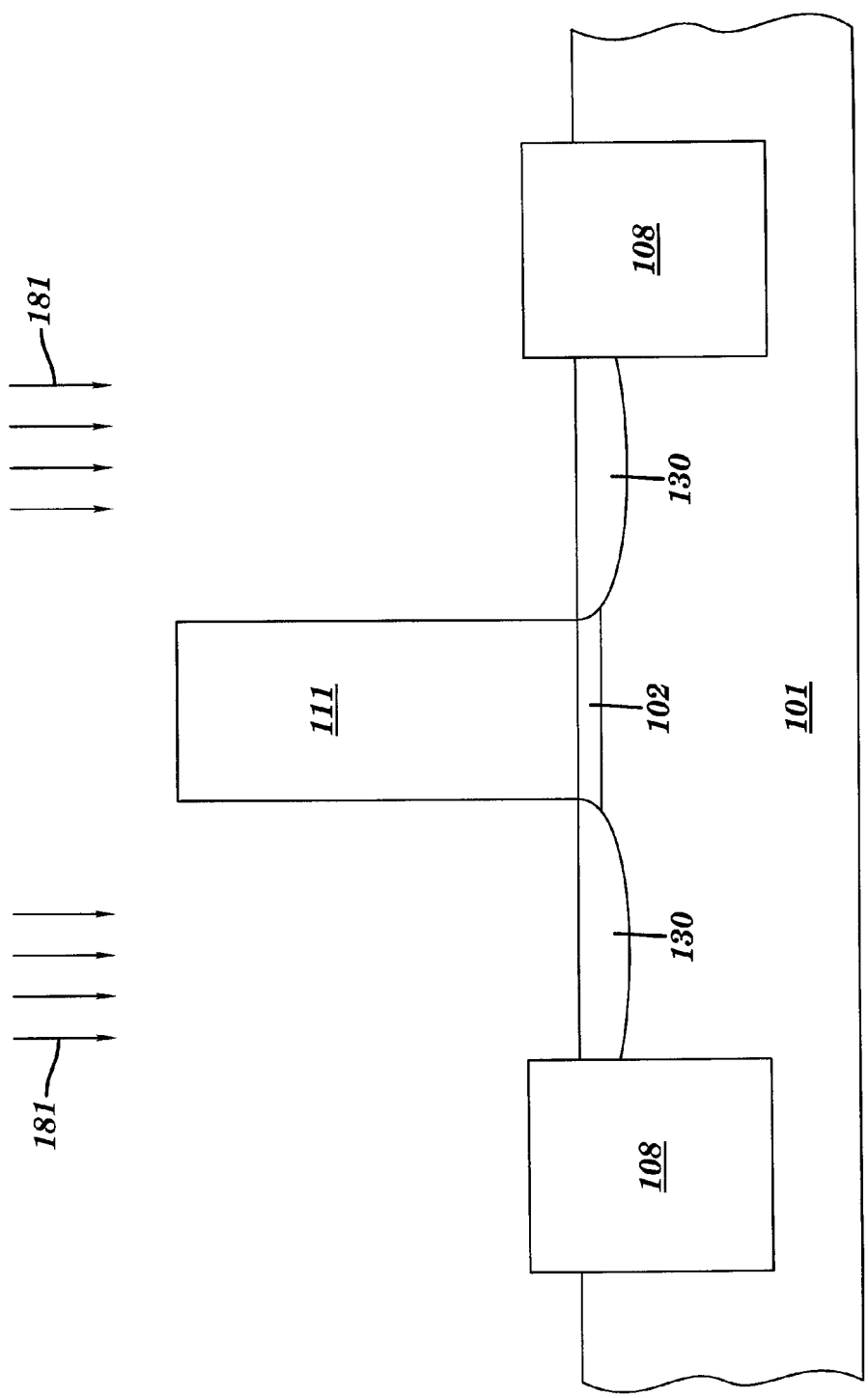
FIGS. 1a to 1c illustrates prior art forming source drain by ion implantation.
Figure 1B:
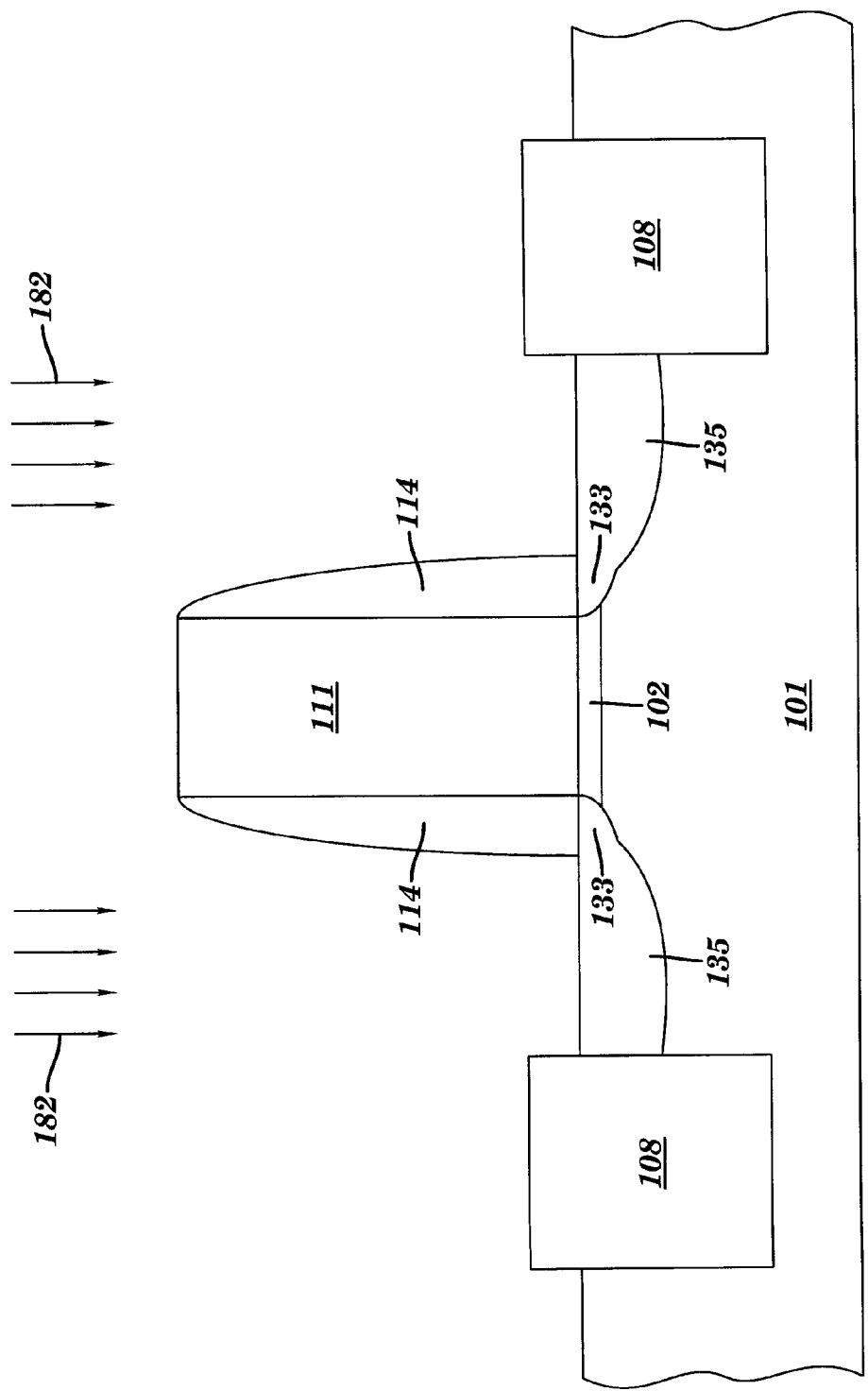
Figure 1C:
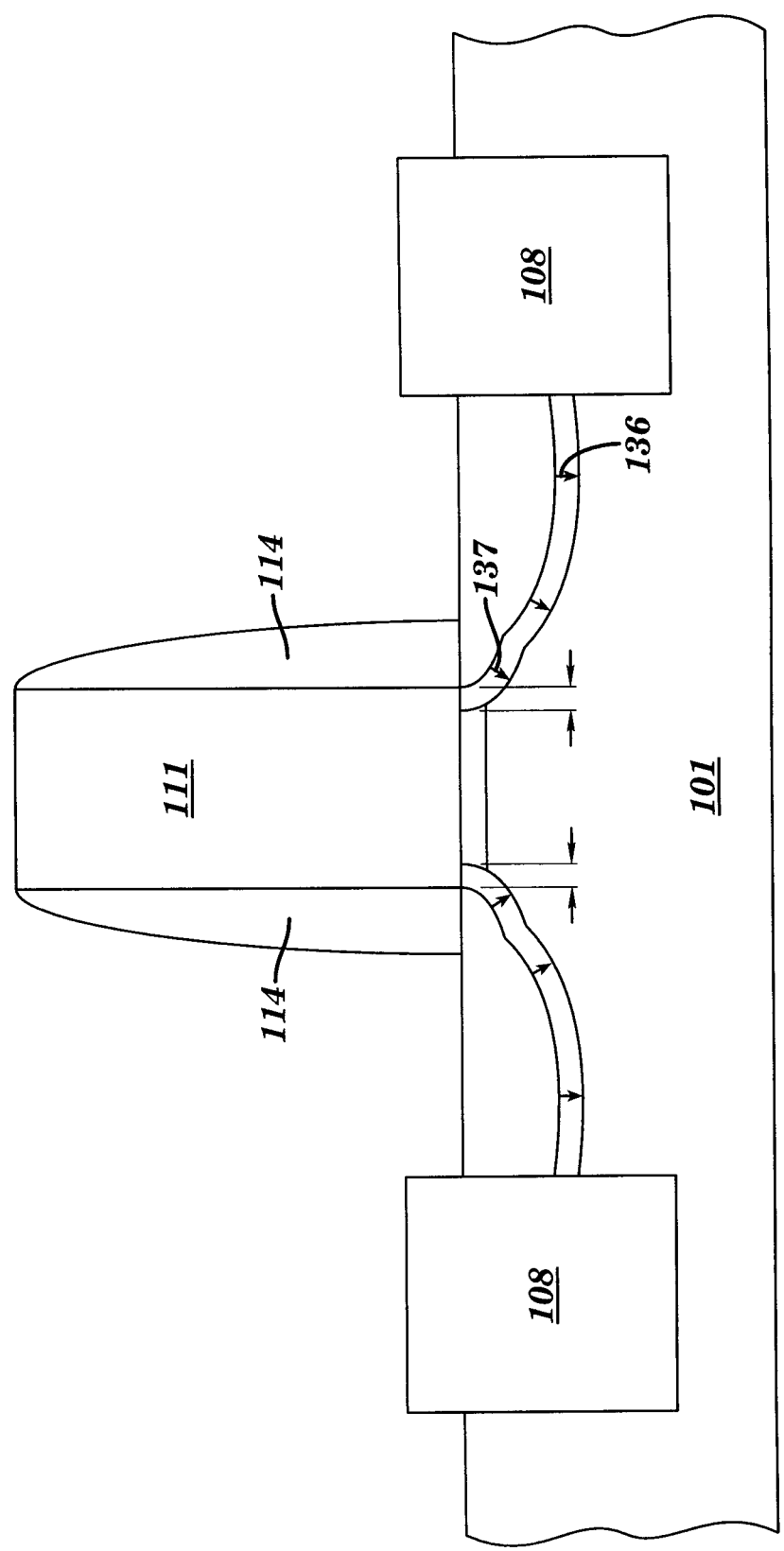
Figure 2A:
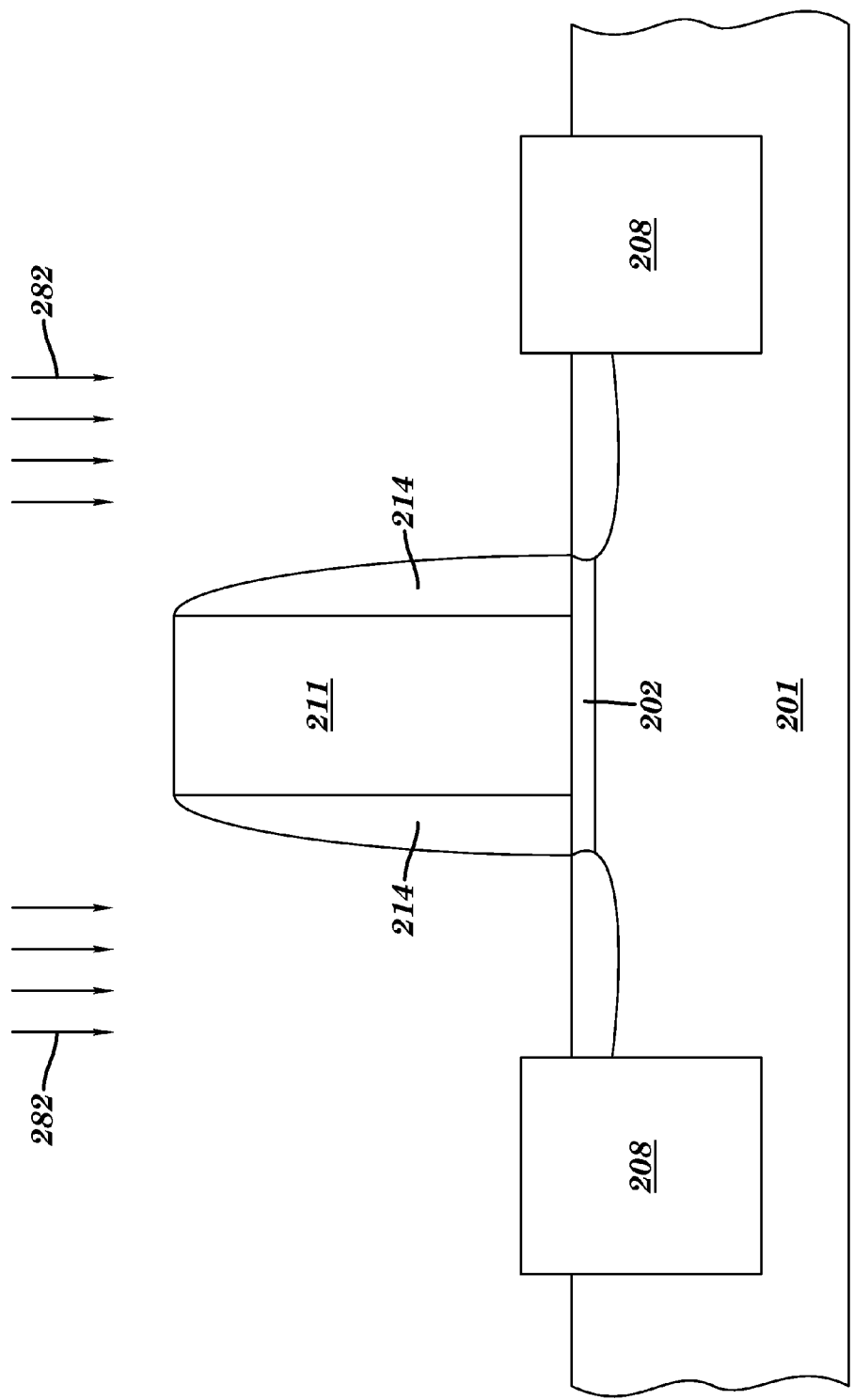
FIGS. 2a and 2b illustrates prior art forming source drain by ion implantation.
Figure 2B:
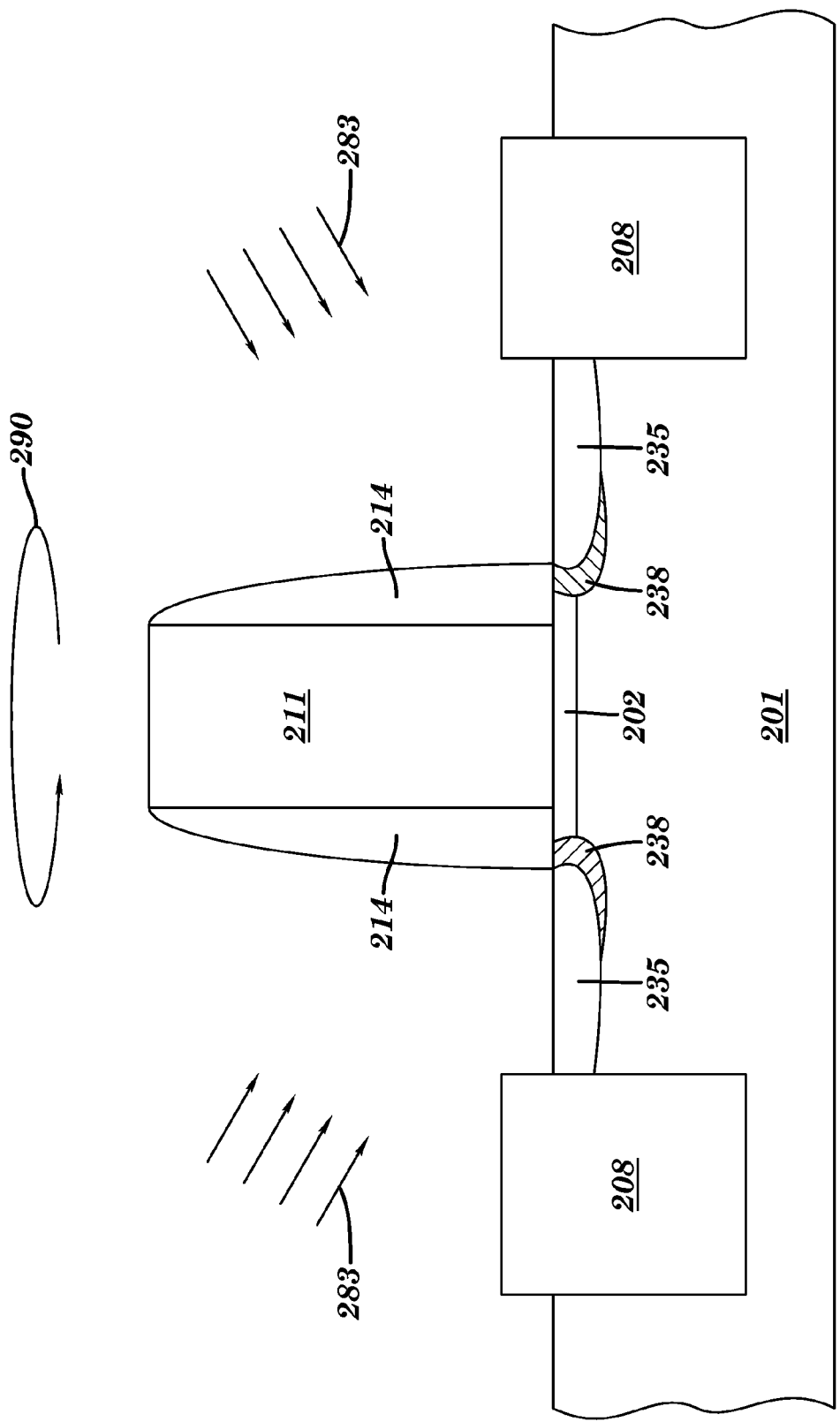
Figure 3:
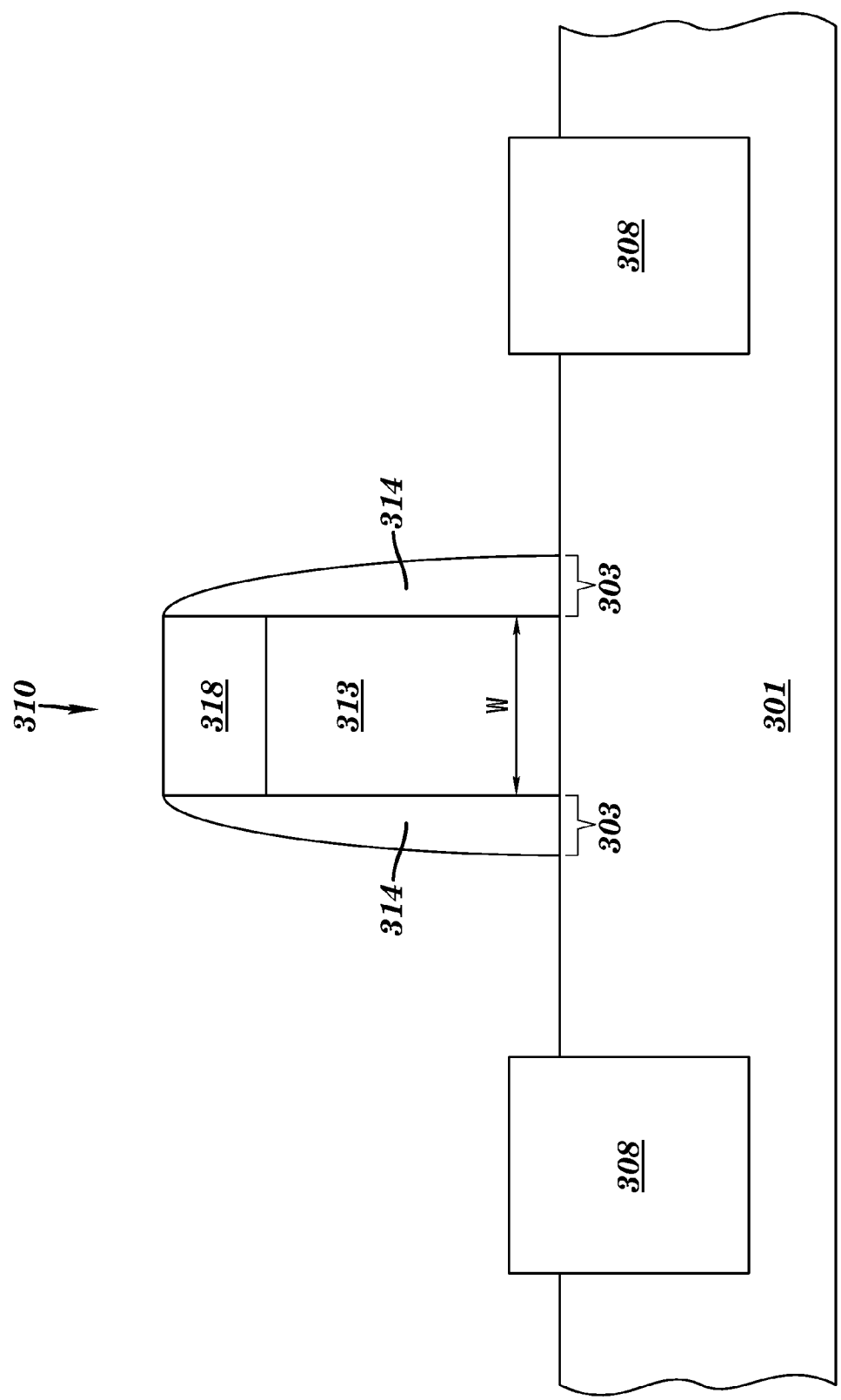
FIG. 3 illustrates an initial structure for a method to form a FET according to an embodiment of the present invention.

Referring now to FIG. 3, a stack 310 can be formed on semiconductor substrate 301 having isolation regions 308. Stack 310 can include electrode 313 and cap 318. Electrode 313 can be a dummy electrode. Lithographic techniques permit forming width W to as small as 10 nm or even 5 nm. Spacer 314 covers the sidewalls of stack 310 and covers a region 303 of the substrate. Spacer 314 can be formed by depositing a material, e.g., a dielectric such as silicon nitride, as a conformal layer and etching to remove the material from horizontal surfaces. The footprint 303 of spacer 314 can be adjusted by proper selection of material and process conditions. Preferably the spacer 314 has substantially rectilinear profile with minimal taper or shoulder at the upper portion.

The semiconductor material of substrate 301 can be bulk silicon or a compound of silicon such as Si:C (carbon doped silicon, with Carbon 0.2-4%) or SiGe (with any Ge content up to about 80% or 90%). The semiconductor material of substrate 301 can include dopants to increase electron or hole mobility. Substrate 301 can be bulk silicon or can comprise layers such as, silicon/silicon germanium, silicon on insulator (SOI), ETSOI (extremely thin semiconductor on insulator), PDSOI (partially-depleted semiconductor on insulator) or silicon germanium-on-insulator. The insulator layers of these can be referred to as a buried oxide (BOX) layer which can be any insulating oxide such as, e.g., silicon dioxide, or even an epitaxial oxide such as Gadolinium(III)-oxide ($Gd_2O_3$). Further, substrate 301 can be a semiconductor wafer, or any part thereof, such as an integrated circuit die singulated from such wafer.

Stack 310 can include a conductive portion that can be formed of polysilicon, but may also include elemental metals, metal alloys, metal silicides, and/or other conductive materials. The material of isolation region 308 can be a dielectric, e.g., silicon dioxide, silicon nitride, silicon oxy nitride.

Figure 4A:
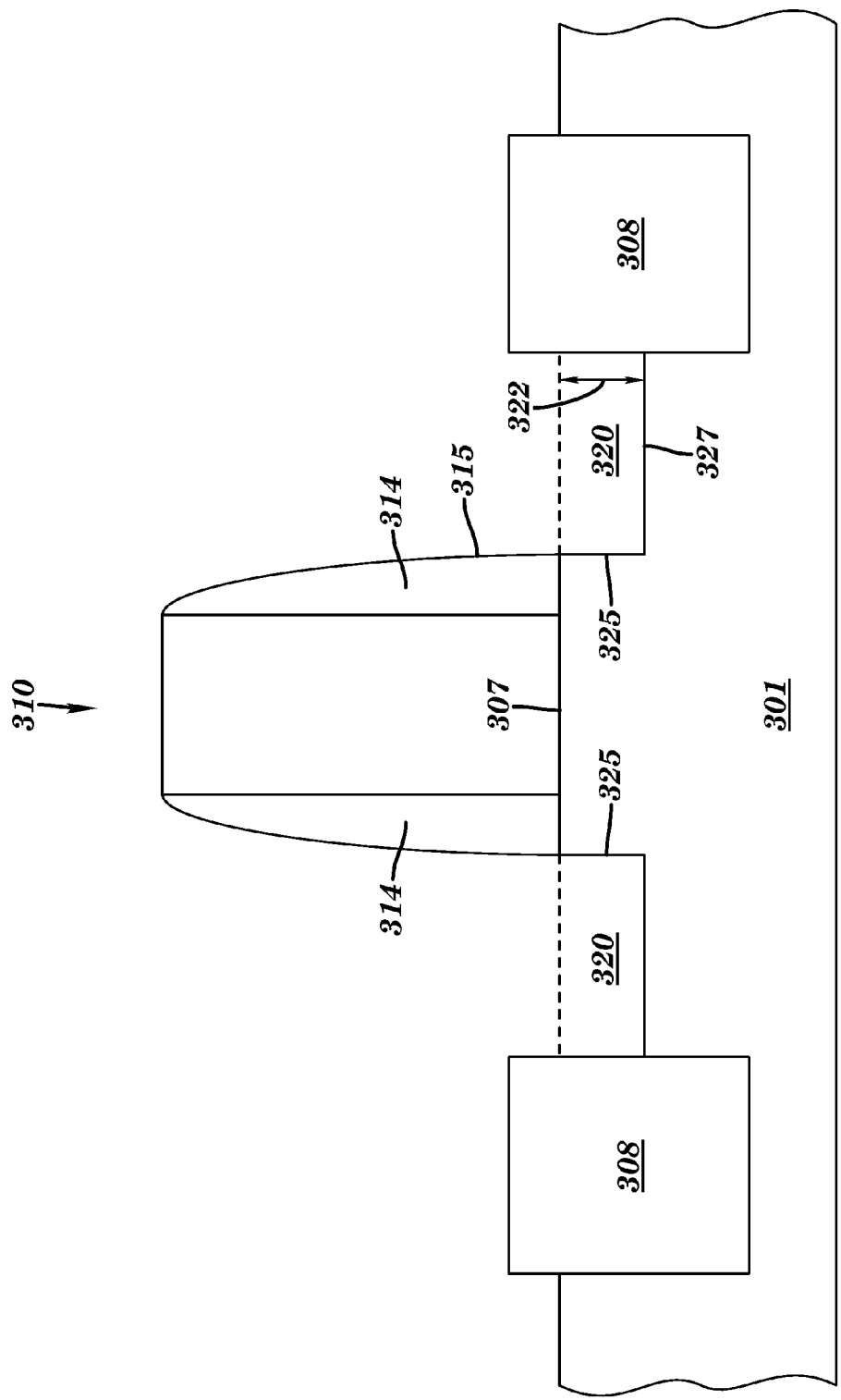
FIG. 4a illustrates forming a source drain according to an embodiment of the present invention.

As used herein, the source and drain pair of a FET are each referred to as a 'source drain' or 'S/D'. Source drain regions 320 are typically formed as a pair on both sides of the stack. One option is to use ion implantation to impart dopant into the S/D region followed by annealing. Alternatively, and as illustrated in FIG. 4a, an etch that is selective to the substrate can recess the substrate between the spacer 314 and the isolation regions 308. A dry reactive ion etch (RIE) can form a highly uniform recess. In certain embodiments the recess can extend below the substrate surface 307 to a depth 322 which can be any depth such as about 50 nm. The depth is an important factor to achieve desired source drain resistivity. The recess can have substantially vertical sidewalls including a channel-facing sidewall 325 defined by and therefore in perfect alignment with the outermost edge 315 of the spacer.

Epitaxial growth can fill the recess to form source drain regions 320. In-situ doped epitaxial growth can incorporate sufficient dopant to impart conductivity. Common dopants include elements in the family of boron or phosphorous. The well (i.e., the substrate under the gate, the upper most part being the channel) can include a dopant that is opposite to the source drain dopant, or in other embodiments, the well can be undoped. The source drain can also be engineered to impart strain to the channel by substituting atoms in the silicon lattice. For example, to form a pFET, the source drain can be formed by the epitaxial growth of silicon germanium crystal, having germanium (Ge) concentration in the range of 10-80%, preferably from about 20-60%. In embodiments, the composition can be 50% Si and 50% Ge. SiGe provides a compressive strain. In embodiments, the material of S/D 320 includes, e.g., boron dopant in the range from $1E19$ $cm^{-3}$ to $2E21$ $cm^{-3}$, preferably from about $3E20$ $cm^{-3}$ to $4E20$ $cm^{-3}$.

To form an nFET, the epitaxial growth can be carbon doped Silicon (Si:C), where the atomic concentration of carbon (C) may be in the range of 0.4 to 3.0%, or between 0.5 and 2.5%. In embodiments, the composition can preferably have carbon concentration between about 1.5 to 2.2%. Si:C provides a tensile strain. The source drain can be in-situ doped by conducting the epitaxial growth in the presence of a dopant such as phosphorous or arsenic. In embodiments, S/D 320 includes phosphorous or arsenic in the range of $1E19$ $cm^{-3}$ to $2E21$ $cm^{-3}$, preferably from about $2E20$ $cm^{-3}$ to $3E20$ $cm^{-3}$.

Figure 4B:
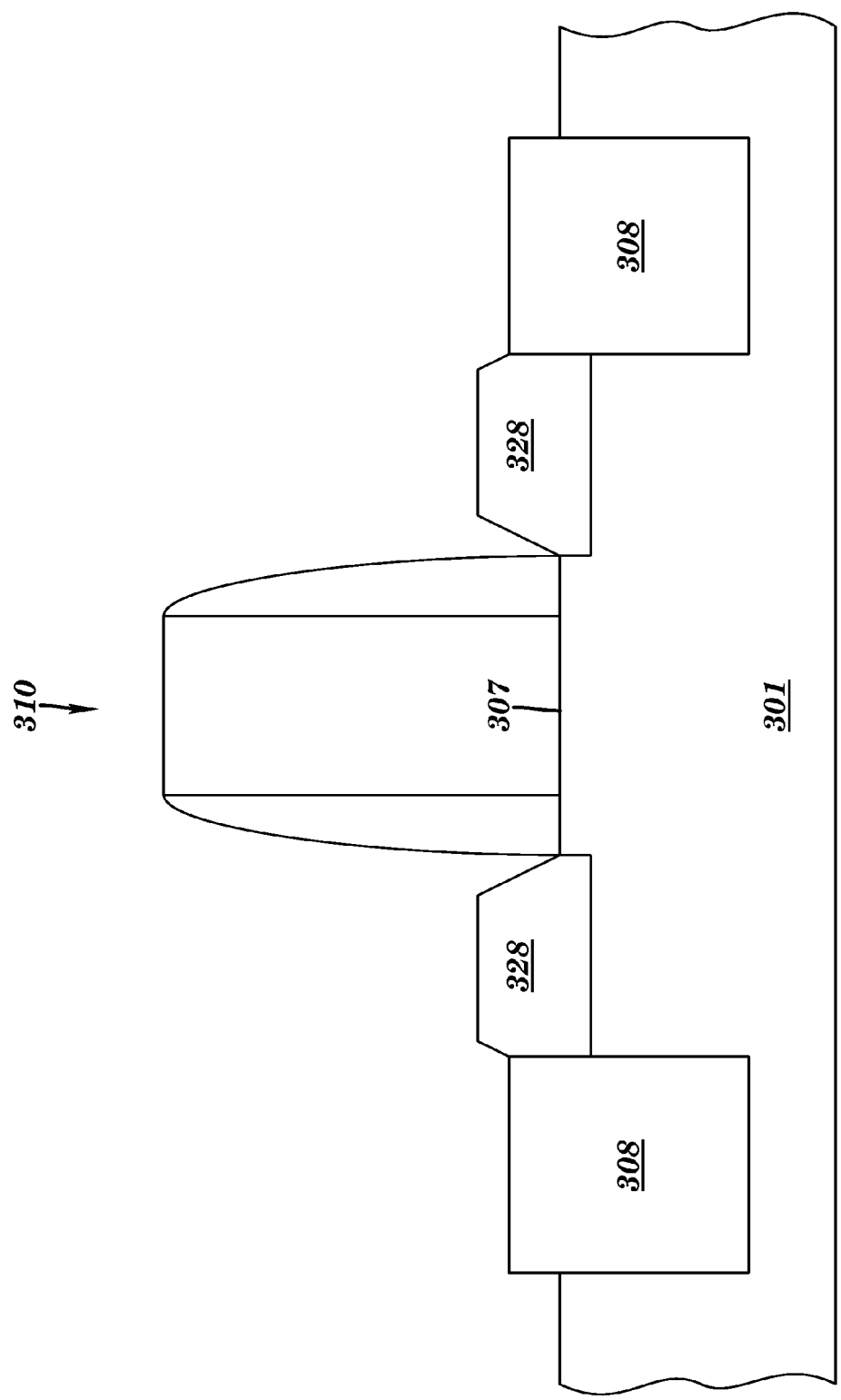
FIG. 4b illustrates a raised source drain embodiment of the source drain forming step of the present invention.

As illustrated in FIG. 4a, the source drain region is fully within the substrate, that is, it is bounded by isolation region 308, a top surface that is coplanar with the top surface of the channel 307, the bottom interface 327 with the substrate below, and a side interface 325 facing the channel region under the gate stack. Other embodiments can include a raised source drain 328 (see FIG. 4b). By extending above the plane of the substrate, raised source drain (RSD) can have similar height as SD 320, yet not extend as deeply into the substrate as source drain 320.

Figure 5A:
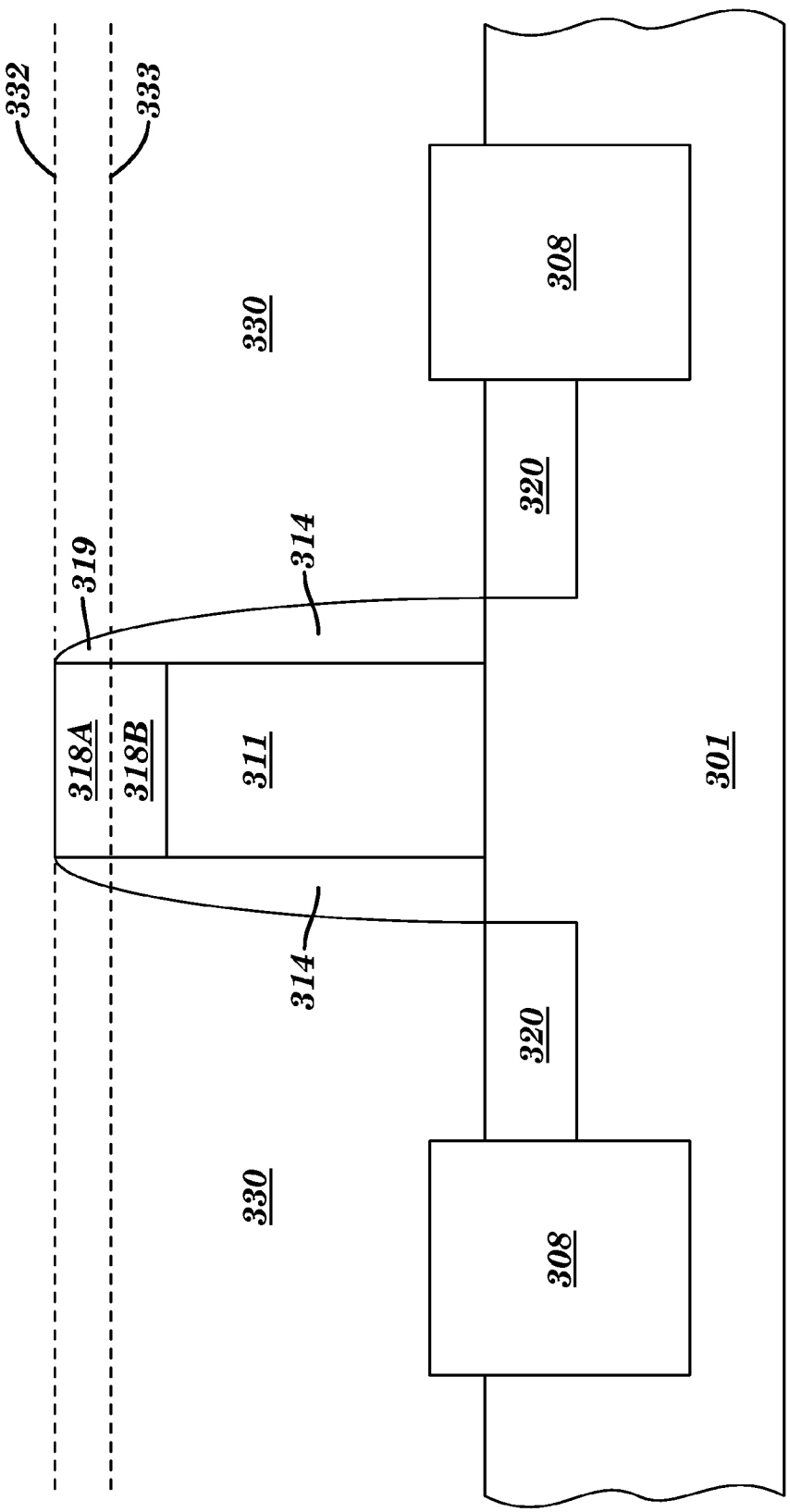
FIG. 5a illustrates initial steps of forming a mask to define an extension region according to a planar source drain embodiment of the present invention.

After forming S/D regions, layer 330 can be deposited to fully cover the structure. Layer 330 preferably flows easily to fill over the source drain and isolation regions 308 and along the outside surface of the spacer 314. Preferably, layer 330 forms a uniform interface (without bubbles or voids) with spacer 314. Planarizing layer 330, such as by CMP (chemical mechanical planarization), can form a flat top surface 332 (FIG. 5a) where the planarizing endpoint is a stop layer which can be the top surface of cap 318 such that the top surfaces of layer 330 and stack 310 are coplanar. Stack 310 can have a cap structure with two layers (A, B), their thickness and materials selected such that the planarizing step continues through layer "A" and stops at the top surface 333 of lower layer "B" such that an upper tapered portion 319 of the spacer 314 is removed. Such a technique or a trim etch or both can optionally be used to eliminate overhanging edges of 330 and leave a substantially rectilinear spacer.

Figure 5B:
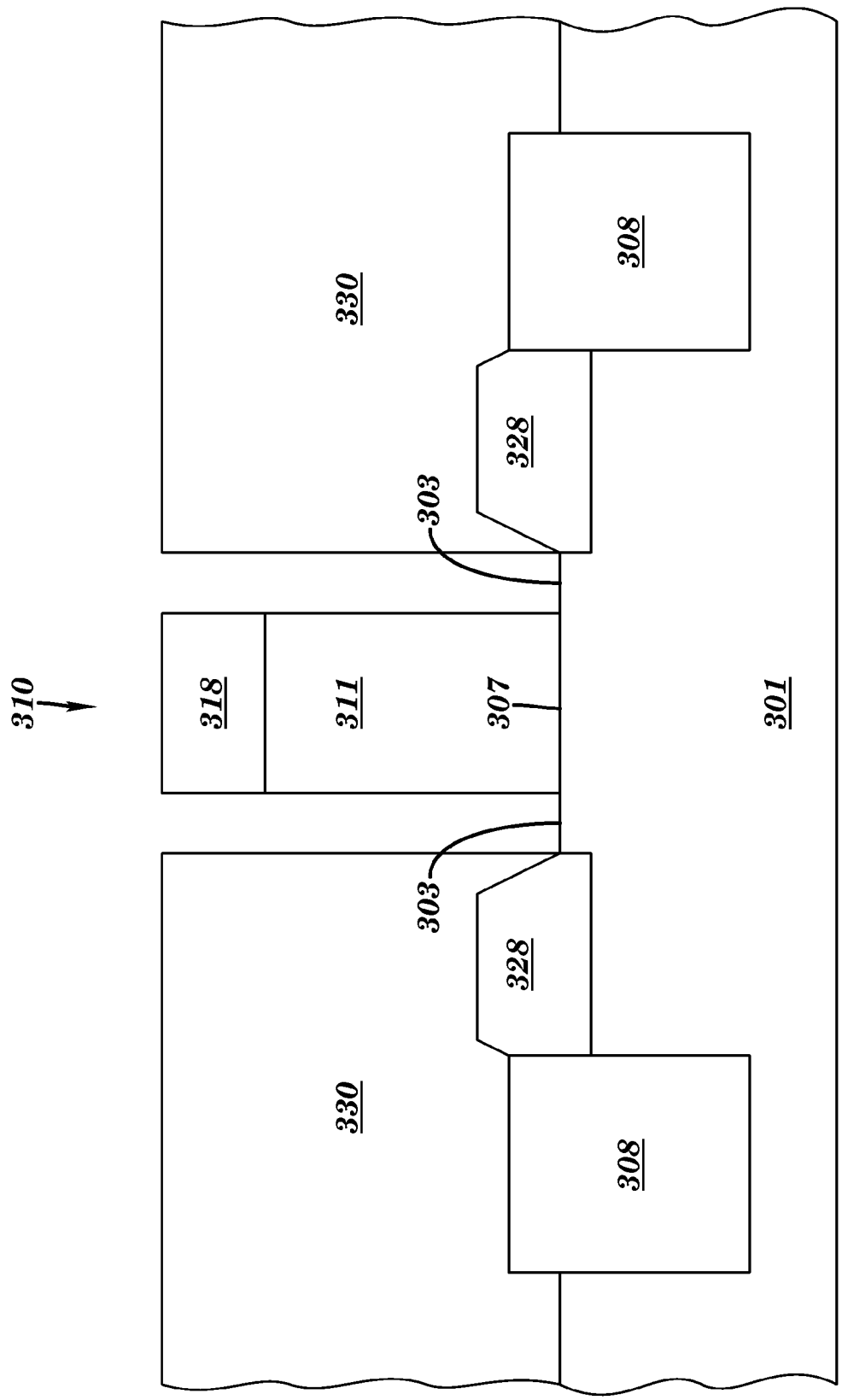
FIG. 5b illustrates further steps to expose an extension region according to a raised source drain embodiment of the present invention.
Figure 6A:
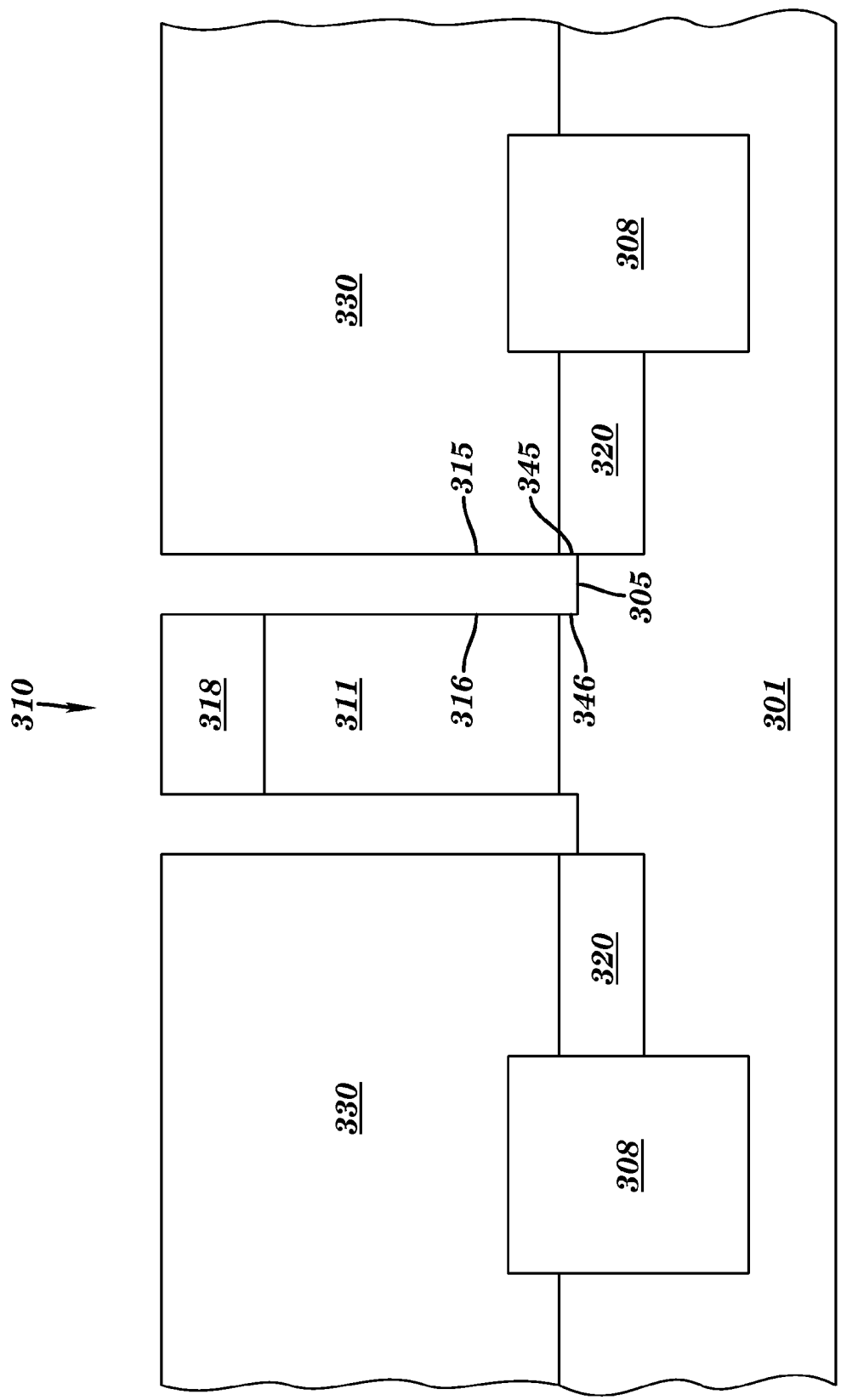
FIGS. 6a and 6b illustrate etching a recess for an extension region according to different embodiments of the present invention.
Figure 6B:
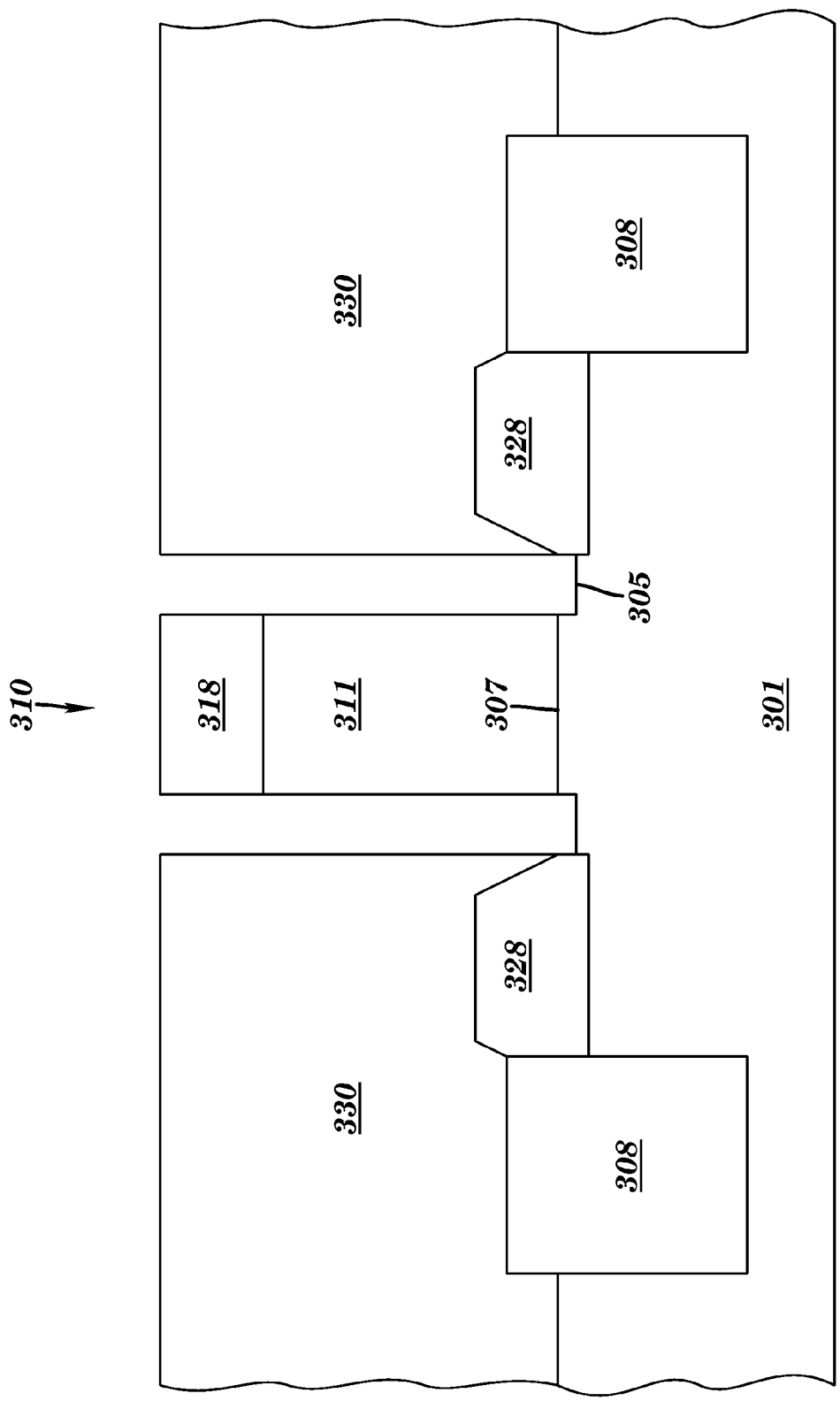

With layer 330 masking everything except stack 310 and spacer 314, spacer can be selectively removed as shown in FIG. 5b. For example, if layer 330 is SiO2, spacer 314 is SiN, and stack 310 is polysilicon, wet etch by hot phosphoric acid or dry etch by CH2F2 or CF8 can remove the spacer, defining a mask where just the spacer footprint 303 on the substrate is exposed. FIGS. 6a and 6b illustrate two embodiments of defining a recess 305 in the exposed substrate. A dry etch such as REI can define recess 305 with an extremely shallow and highly uniform depth, such as between 1 and 20 nanometers, or preferably in the range of 2 to 6 nm. The target depth of recess 305 can be in the range of 3 to 5 nm. The depth of recess 305 can be much less than the depth of S/D 320, or in a RSD embodiment, the depth of recess 305 can be the same or different than the depth of S/D 328.

Figure 6C:
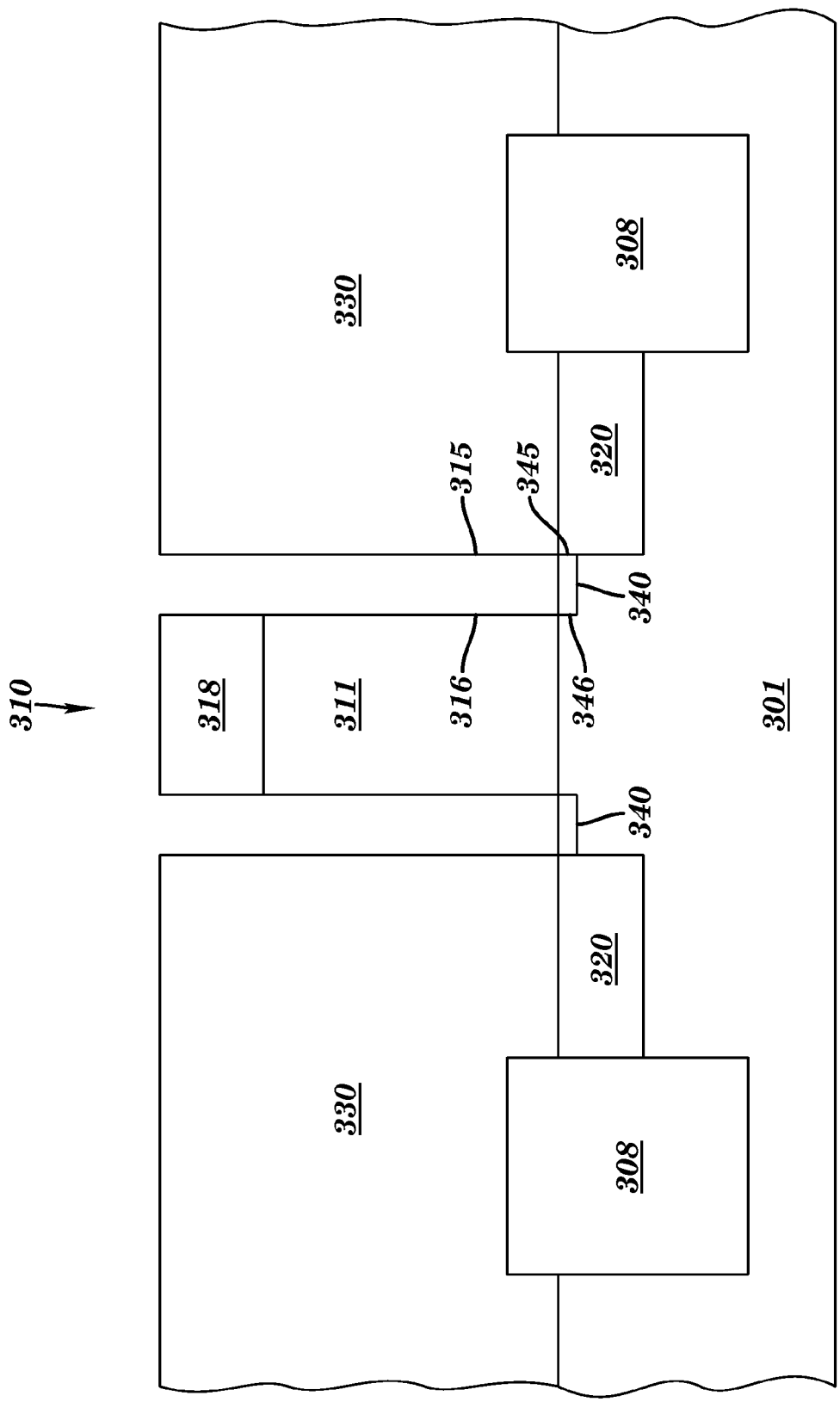
FIG. 6c illustrates forming the extension region by epitaxial growth according to an embodiment of the present invention.

Recess 305 can have substantially vertical sidewalls 346 and 345 that are aligned respectively to the edge 316 of stack 310 and the spacer edge 315. The location of the channel-facing sidewall 346 is defined by the sidewall 316 of stack 310. FIG. 6c depicts extensions 340 formed by epitaxial growth to fill recesses 305 in a planar S/D embodiment. Sidewall 346 constitutes an abrupt boundary between an extension which includes dopant X at a substantially uniform concentration and the channel which is either undoped or includes an opposite dopant. That is, sidewall 346 defines an abrupt junction between the extension side composition that could, for example, include 3E20 cm-3 boron and the channel side composition with no dopant or an opposite dopant such as, e.g., phosphorous in the range of about 1E17 to 1E20 atom per cc. Furthermore, the separation of the pair of extension regions 340 at opposite ends of the same channel is precisely the same as the width W of stack 310.

The opposite sidewall 345 abuts the source drain. The epitaxy conditions to fill recess 305 can be set to form the same crystal composition and include the same dopant as the adjacent S/D, i.e., extension dopant X can be the same species and the same concentration as source drain dopant Y. But dopant X need not be the same species or concentration as dopant Y, in which case sidewall 345 constitutes an abrupt boundary between the extension and the source drain. Relative to the extension dopant X, the source drain dopant Y can be a different species, or can be the same species at a different concentration, or can be a different species and a different concentration. For example, the dopant concentration of the extension 340 can be lower than in the adjacent S/D.

The 'abrupt' boundary of this epitaxially-grown extension defines an immediate compositional change, in contrast to the graded boundary region that is inherent to implantation and anneal techniques. The boundary of a source drain region formed by ion-implantation and anneal constitutes a transition region with a dopant gradient and has substantial width of tens of nanometers to transition from the nominal source drain concentration to an inactive concentration that may be three or more orders of magnitude less than nominal. In contrast, the abrupt boundary of the present invention has width of less than 5 or even 2 nanometers because it essentially has no thickness.

Stack 310 can be a dummy gate stack, constituting a mask for etching the extension recess. Once that etch is complete, stack 310 can be removed, leaving a cavity with a bottom defined by substrate 301 and the top surface of extensions 340, and sidewalls defined by layer 330.

Figure 7:
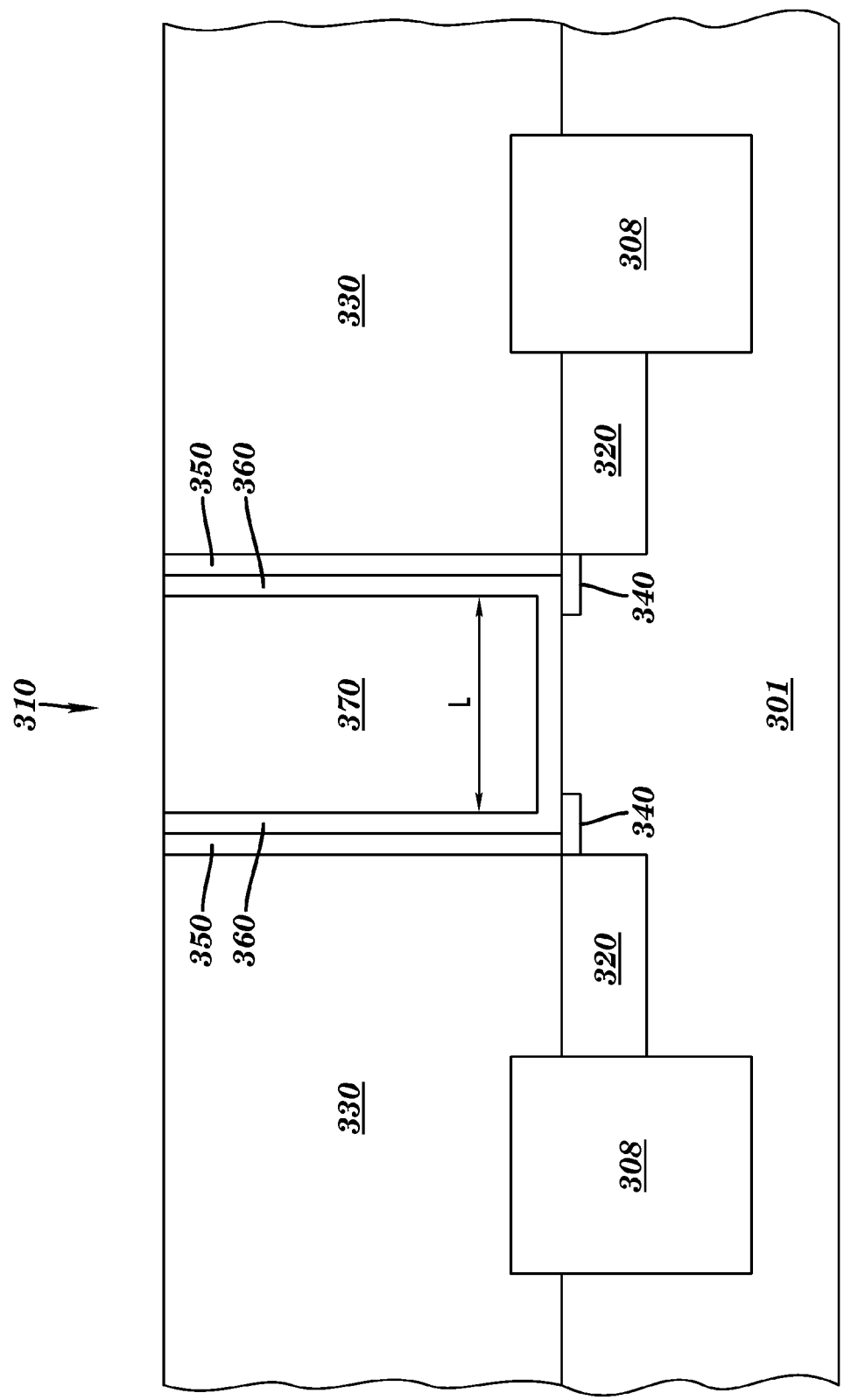
FIG. 7 illustrates a FET formed according to an embodiment of the present invention.

FIG. 7 illustrates forming a replacement gate in the cavity. An inner spacer 350 can be formed by conformal deposition, such as SiN, followed by a directional etch to remove the material from horizontal surfaces. Spacer 350 can be formed with a thickness less than that of spacer 314 so that the gate-side end of extension region 340 remains uncovered. The remaining cavity can be lined with gate dielectric 360, and filled by metal or metals to form the gate electrode. Depending on the thickness of gate dielectric 360 (and spacer 350), the gate electrode can be aligned to the edge of the extension, or it can overlap the extension tip (as illustrated in FIG. 7), or it can be narrower than the channel. Thus, the FET can be manufactured such that the electrode width L is different from the channel length W.

Since the extension dopants are grown in-situ in an epitaxial manner, they are already activated. If desired, the structure can be exposed to a flash or spike anneal such as to between 900 to 1100 C to increase activation with minimal dopant dispersion.

Gate dielectric 360 is a dielectric material which can comprise one or combinations of silicon oxide ($SiO_2$), silicon nitride, silicon oxynitride, boron nitride, and high-k dielectrics such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

The gate electrode can be composed of TiN, TaN or any other material or set of materials that can provide appropriate workfunction. The stack can also contain sacrificial layers and metal layers to lower the overall resistance of the line.

It will be apparent to those skilled in the art having regard to this disclosure that other modifications of the exemplary embodiments beyond those embodiments specifically described here, such as implementation of the disclosed method in the context of a FinFET, may be made without departing from the spirit of the invention. Accordingly, such modifications are considered within the scope of the invention as limited solely by the appended claims.

What is claimed is:

1. A method to form a MOSFET, said MOSFET having a gate electrode disposed on a semiconductor substrate and over a channel region, said channel region between a pair of source drain regions, the method comprising:
    forming a first stack on the semiconductor substrate;
    forming a first and a second spacer on a first and a second sidewall of the formed first stack, wherein the first and the second spacers are substantially rectilinear in profile;
    forming, within the semiconductor substrate, a first recess adjacent the first spacer, wherein a sidewall of the first recess and a side wall of the first spacer are substantially vertically aligned; the entirety of the length of the bottom surface of the first recess is substantially parallel to the semiconductor substrate; the sidewalls of the first recess are substantially perpendicular to the bottom surface of the first recess; and the sidewalls of the first recess are substantially vertical;

forming, within the semiconductor substrate, a second recess adjacent the second spacer, wherein a sidewall of the second recess and a sidewall of the second spacer are substantially vertically aligned; the entirety of the length of the bottom surface of the first recess is substantially parallel to the semiconductor substrate; the sidewalls of the first recess are substantially perpendicular to the bottom surface of the first recess; and the sidewalls of the second recess are substantially vertical;

forming a first and a second source drain region within the first recess and the second recess, respectively, wherein the first and the second source drain regions are epitaxially filled;

removing the first and second spacers in their entirety selective to the first stack and a dielectric layer such that a top surface of the semiconductor substrate is exposed;

forming a third recess and a fourth recess by etching the semiconductor substrate exposed between the first stack and the dielectric layer, such that the third recess and the fourth recess border the first and second source drain region respectively, and a width of the third recess and the fourth recess is substantially equal to a width of the first spacer and the second spacer;

forming a first extension region by epitaxially filling the third recess, wherein the boundary formed between the first source drain region and the first extension region is substantially vertical, the sidewalls of the first extension region are substantially parallel, the bottom surface of the first extension region is substantially parallel to the semiconductor substrate, and wherein the first extension region is substantially rectilinear;

forming a second extension region by epitaxially filling the fourth recess, wherein the boundary formed between the second source drain region and the second extension region is substantially vertical, the sidewalls of the second extension region are substantially parallel, the bottom surface of the second extension region is substantially parallel to the semiconductor substrate, and wherein the second extension region is substantially rectilinear;

forming a gate cavity structure by etching the first stack;

forming a third and a fourth spacer on a first and a second sidewall of the formed gate cavity structure;

lining both the gate cavity structure and the third and fourth spacer with a gate dielectric; and forming the gate electrode by filling the gate cavity, wherein the entirety of the gate electrode is substantially rectilinear, wherein the base of the gate electrode overlaps with the first and the second extension region and, wherein a width of the gate electrode is greater than a width of the first stack.

2. The method of claim 1 wherein the first and the second source drain regions are in-situ doped with boron or phosphorous in the range of 1E19 cm-3 to 2E21 cm-3.

3. The method of claim 1 wherein said forming said first and second source drain regions is by ion implantation.

4. The method of claim 1 wherein said third recess and said fourth recess have a depth not exceeding 20 nm.

5. The method of claim 1 wherein said first extension region and said second extension region comprise a semiconductor composition having a lattice spacing different than that of the channel region.

* * * * *